United States Patent
Wu et al.

(10) Patent No.: US 8,341,202 B2
(45) Date of Patent: Dec. 25, 2012

(54) CODE DIVISION MULTIPLE ACCESS (CDMA) SYSTEM FOR CALCULATING COEFFICIENTS OF FILTER AND METHOD FOR FILTERING A RECEIVED SIGNAL

(75) Inventors: Wei-De Wu, Hsinchu (TW); Shin-Yuan Wang, Hsinchu (TW)

(73) Assignee: Sunplus mMobile Inc., Hsinchu (TW)

( * ) Notice: Subject to any disclaimer, the term of this patent is extended or adjusted under 35 U.S.C. 154(b) by 1050 days.

(21) Appl. No.: 12/331,404

(22) Filed: Dec. 9, 2008

(65) Prior Publication Data

US 2009/0164542 A1 Jun. 25, 2009

(30) Foreign Application Priority Data

Dec. 19, 2007 (TW) ................................ 96148688 A

(51) Int. Cl.
*G06F 17/10* (2006.01)
*G06F 17/14* (2006.01)
(52) U.S. Cl. ........ 708/323; 708/403; 708/426; 708/300; 708/321; 708/322; 375/227; 375/329
(58) Field of Classification Search .......... 708/321–323, 708/404; 375/227, 329
See application file for complete search history.

(56) References Cited

U.S. PATENT DOCUMENTS

| | | | |
|---|---|---|---|
| 6,002,716 A | 12/1999 | Meyer et al. | |
| 6,031,882 A | 2/2000 | Enge et al. | |
| 6,175,588 B1 | 1/2001 | Visotsky et al. | |
| 6,615,227 B2 * | 9/2003 | Aizenberg et al. | 708/404 |
| 6,862,326 B1 | 3/2005 | Eran et al. | |
| 6,873,596 B2 | 3/2005 | Zhang et al. | |
| 7,010,070 B2 | 3/2006 | Li et al. | |
| 7,030,814 B2 | 4/2006 | Stone et al. | |
| 7,151,797 B2 | 12/2006 | Limberg | |
| 7,738,578 B2 * | 6/2010 | Ktenas et al. | 375/260 |
| 7,965,649 B2 * | 6/2011 | Tee et al. | 370/252 |
| 8,036,257 B2 * | 10/2011 | Mailaender | 375/148 |
| 2006/0154633 A1 * | 7/2006 | Wang | 455/226.3 |
| 2007/0217495 A1 * | 9/2007 | Han et al. | 375/227 |
| 2010/0177713 A1 * | 7/2010 | Yoshii et al. | 370/329 |

OTHER PUBLICATIONS

"SINR-based channel pre-equalization for uplink multi-carrier CDMA systems," by Mottier, David et al.,Sep. 2002, pp. 1-5.*
A. Ahlen and M. Sternad, "Wiener filter design using polynomial equation" IEEE Trans. Signal processing, vol. 39, No. 11, pp. 2387-2399, Nov. 1991.
T.N.T. Goodman C. A. Micchelli, G Rodriguez. and S. Seatzu, "Spectral factorization of Laurent polynomials," Springer J. Advances Computational Math., vol. 7, No. 4, pp. 429-454, Aug. 1997.
ITU-R, "Guidelines for the evaluation of radio transmission technologies for IMT-2000", ITU-R Recommendation M. 1225, 1997.

* cited by examiner

*Primary Examiner* — Tammara Peyton
(74) *Attorney, Agent, or Firm* — Jianq Chyun IP Office

(57) ABSTRACT

A method for calculating coefficients of a filter and a method for filtering are provided. The invention directly factorizes a specific function in a cepstrum domain by spectral factorization and cepstrum technique to obtain coefficients of denominator function from the filter. In other words, the invention adopts a non-iterative algorithm to reduce computational complexity and avoid convergence due to calculating coefficients. Besides, the specific function of the invention includes a compensation function, so that a Fourier transform with greatly reduced size can be utilized in the spectral factorization to greatly save the computations and keep good system performance at a receiver.

13 Claims, 7 Drawing Sheets

CODE DIVISION MULTIPLE ACCESS (CDMA) SYSTEM FOR CALCULATING COEFFICIENTS OF FILTER AND METHOD FOR FILTERING A RECEIVED SIGNAL

CROSS-REFERENCE TO RELATED APPLICATION

This application claims the priority benefit of Taiwan application serial no. 96148688, filed on Dec. 19, 2007. The entirety of the above-mentioned patent application is hereby incorporated by reference herein and made a part of this specification.

BACKGROUND OF THE INVENTION

1. Field of the Invention

The present invention generally relates to a filter technique, in particular, to a method for calculating coefficients of a filter.

2. Description of Related Art

In a communication system, an equalizer of receiver is capable of eliminating interferences of received signal caused by channel, and the equalizer can be classified into an infinite impulse response (IIR) equalizer and a finite impulse response (FIR) equalizer. In terms of performance, the IIR equalizer is capable of achieving minimum mean-square error (MMSE), which is obviously superior to the FIR equalizer. However, when calculating the coefficients of the IIR equalizer, spectral factorization or other iterative algorithms such as Kalman algorithm must be used. If a non-iterative spectral factorization such as a cepstrum method is used to calculate the coefficients of the IIR equalizer, the Fourier transform with a large size must be used, and a sufficient high spectrum sampling rate is required to ensure the accuracy of the factorization. Thus the corresponding excessive high computational complexity severely inhibits the application of the cepstrum method. If an iterative algorithm is used, the time consumption and the convergence problem must be considered. Therefore, the IIR equalizer must carry out excessively computations or spend a lot of time to calculate the coefficients thereof. Moreover, in terms of the circuit design, the complexity of the IIR equalizer becomes relatively high. In addition, a transfer function of the IIR equalizer is divided into a numerator function and a denominator function. If the pole of the denominator function of the IIR equalizer is excessively close to a unit cycle on the z plane, the IIR equalizer tends to be unstable.

In contrast, since the FIR has smaller computations, lower complexity, and without the problem of instability, it still has been widely used in the equalizer of the current receiver even if the performance of FIR is significantly lower than that of the IIR.

SUMMARY OF THE INVENTION

The present invention is directed to a method for filtering, which is used for simplifying the denominator function of the filter, reducing multiplication computation during filtering and thereby reducing the computations of the filtering.

The present invention provides a method for calculating coefficients of a filter, in which the filter is adapted to an equalizer of a receiver, so as to eliminate the interferences to received signals at the receiver caused by a transmission channel, and the filter has a denominator function and a numerator function. The method includes estimating a channel response (step a); estimating a signal-to-interference-plus-noise power ratio (SINR) (step b); calculating an autocorrelation function of the channel response (step c); summing the autocorrelation function of the channel response, a reciprocal value of the SINR, and a compensation function, so as to obtain a specific function (step d); retrieving a plurality of coefficients of the specific function (step e); performing a cepstrum computation on the plurality of coefficients, so as to obtain a plurality of quefrency coefficients (step f); selecting a part of the quefrency coefficients to perform a Fourier transform with a limited size, so as to obtain a plurality of spectral components (step g); performing an exponential computation on the plurality of spectral components, so as to obtain a plurality of exponential spectral components (step h); performing an inverse Fourier transform with a limited size on the exponential spectral components, so as to obtain a plurality of coefficient candidates (step i); taking a part of the coefficient candidates, and then performing normalization on the part of the coefficient candidates to serve as the coefficients for the denominator function of the filter, so as to form the denominator function (step j); and calculating coefficients of the numerator function of the filter by using the coefficients of the denominator function of the filter and the channel response, so as to form the numerator function (step k).

The present invention provides a method for filtering, which includes receiving a received signal from a transmission channel; calculating a denominator function and a numerator function of a filter, in which the denominator function has a plurality of coefficients; filtering the received signal according to the numerator function by using a feed-forward filter, so as to obtain a numerator filtered signal; providing a threshold value; sequentially determining whether the coefficient of the denominator function is smaller than the threshold value or not; sequentially setting the coefficients smaller than the threshold value to a preset value, so as to adjust the denominator function as an equivalent denominator function; and filtering the numerator filtered signal according to the equivalent denominator function by using a feedback filter, so as to obtain a final filtered signal. The length of the denominator function is expressed as L, the coefficients of the denominator function are expressed as $\{a_n\}_{n=0}^{L-1}$, the threshold value is expressed as $\eta/L$, where $\eta$ is a preset positive integer, the preset value is 0, and the equivalent denominator function is $$\tilde{a}_n = \begin{cases} a_n, & \text{if } |a_n|^2 \geq \eta/L \\ 0, & \text{if } |a_n|^2 < \eta/L \end{cases}.$$

The above numerator filtered signal is expressed as $\{v_n\}_{n=-L}^{L-1}$, and the final filtered signal is $$\hat{x}_n = \begin{cases} v_n - \sum_{m=1}^{L-1} \tilde{a}_m \hat{x}_{n-m}, & \text{if } n > 0 \\ 0, & \text{if } n \leq 0 \end{cases}.$$

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
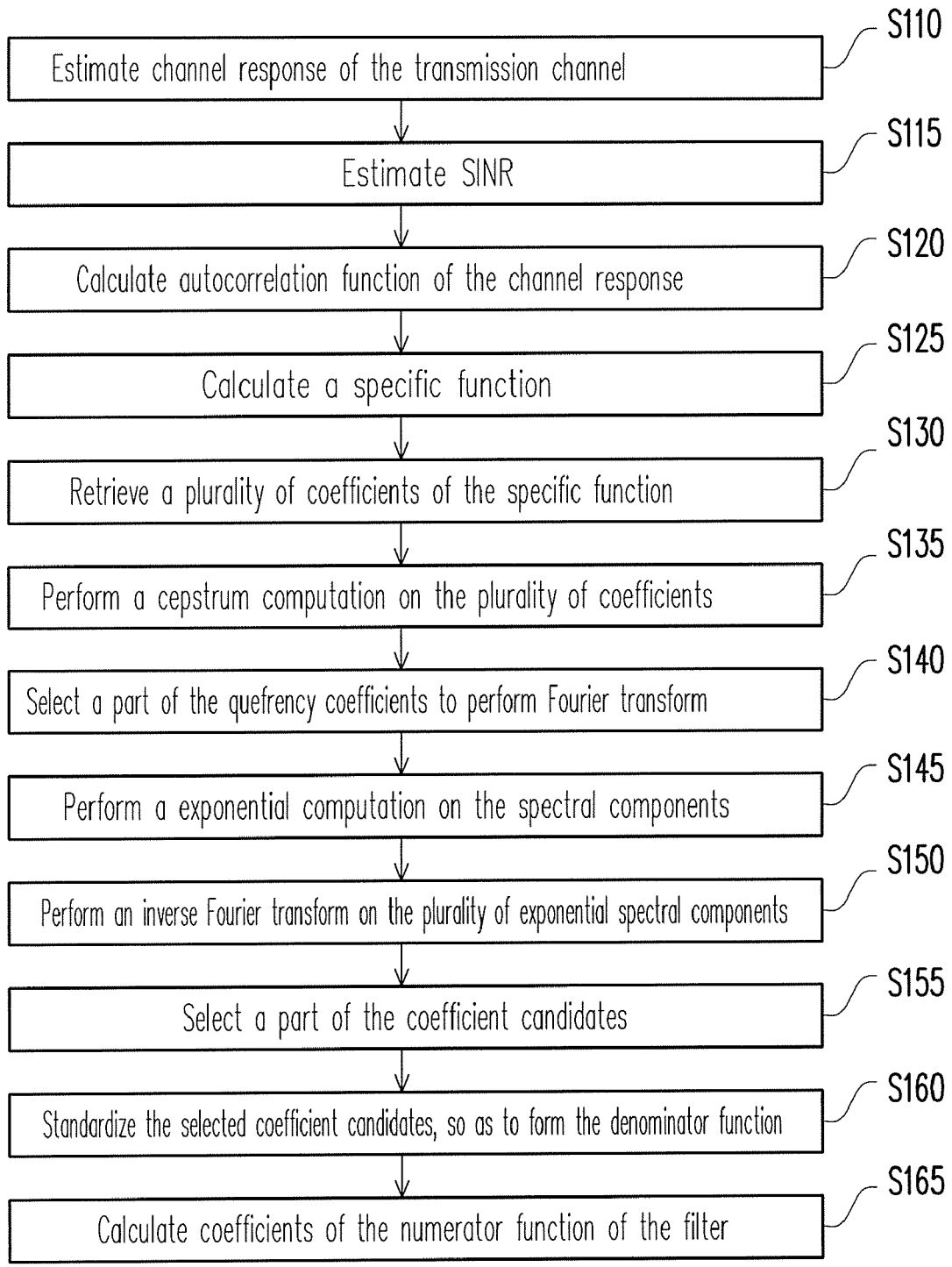
FIG. 1 is a flow chart of method for calculating coefficients of a filter according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart of method for calculating coefficients of a filter according to an embodiment of the present invention. Firstly, it is supposed that the filter is used in an equalizer of receiver in a communication system to eliminate interferences of received signal from the receiver caused by transmission channel. A z transform of the received signal passing through the transmission channel is expressed as:

$Y(z) = H(z)X(z) + N(z)$, in which $X(z)$ indicates a signal transmitted by transmitter, $H(z)$ indicates a transfer function of the transmission channel, $N(z)$ indicates noises and interferences in the channel. Then, it is supposed in this embodiment that the filter is a generalized IIR filter, and the z transform of the transfer function thereof is expressed as $$W(z) = \frac{B(z)}{A(z)},$$

in which $A(z)$ indicates a denominator function, and $B(z)$ indicates a numerator function. Then, this embodiment is illustrated below.

Referring to FIG. 1, firstly, the receiver estimates a channel response of the transmission channel (step S110). The estimated channel response is expressed as $\hat{h}(n)$ in time domain, the z transform thereof is expressed as $\hat{H}(z) = \Sigma_n \hat{h}(n) z^{-n}$, and the length of the channel response $\hat{H}(z)$ is expressed as L. In other words, in step S110, while estimating the channel response, the channel length is estimated as L. Then, the receiver estimates a signal-to-interference-plus-noise power ratio (SINR) in the received signal (step S115). As for the current communication techniques, the above-mentioned estimating the channel response and estimating the SINR both belong to the conventional art, and thus are not described in detail in this embodiment.

Then, an autocorrelation function of the channel response is calculated (step S120). The autocorrelation function of the channel response may be expressed as $\hat{H}(z)\hat{H}_\#(z)$, in which $\hat{H}_\#(z) = \hat{H}^*((z^*)^{-1}) = \Sigma_n \hat{h}^*(n) z^n$. In this embodiment, in order to achieve the most desirable linear equalizer, the filter must satisfy a minimum mean-square error (MMSE) criterion.

From the aspect of mathematics, the transfer function $W_{MMSE}(z)$ of the filter satisfying the MMSE criterion needs to satisfy the mathematical equation:

$$W_{MMSE}(z) = \underset{W(z)}{\arg\min} |W(z)Y(z) - z^{-M} X(z)|^2. \qquad (1)$$

In other words, the transfer function $W(z)$ of the filter enabling $|W(z)Y(z) - z^{-M}X(z)|^2$ to be minimized is obtained. The document mentioned in Note [1] has already derived the denominator function $A(z)$ satisfying the above Equation (1), which satisfies the mathematical equation:

$$H(z)H_\#(z) + SINR^{-1} = \alpha A(z)A_\#(z) \qquad (2).$$

As known from the above Equation (2) that, if $H(z)H_\#(z) + SINR^{-1}$ is factorized through using the spectral factorization technique, the denominator function $A(z)$ is obtained. Furthermore, after obtaining the denominator function $A(z)$, the numerator function $B(z)$ can be obtained by the denominator function $A(z)$. Therefore, after step S120, the autocorrelation function $\hat{H}(z)\hat{H}_\#(z)$ of the channel response obtained in step S110-S120, a reciprocal value of the estimated SINR, and a compensation function are summed up, so as to calculate a specific function (step S125). The compensation function is expressed as $C_p(z)$, and the specific function is expressed as $G(z)$. In order to facilitate the illustration, firstly the compensation function $C_p(z)$ is supposed to be 0, and how to design the compensation function $C_p(z)$ will be illustrated in the following embodiments. At this time, the mathematical equation $G(z)$ is expressed as:

$$G(z) = \hat{H}(z)\hat{H}_\#(z) + SINR^- \qquad (3),$$

in which the SINR indicates the SINR estimated in step S115, −1 indicates a reciprocal computation. The specific function $G(z)$ obtained in step S125 is further expressed as:

$$G(z) = g_{-L+1} z^{-L+1} + g_{-L+2} z^{-L+2} + \ldots + g_0 + g_1 z + \ldots + g_{L-1} z^{L-1} \qquad (4).$$

After calculating the specific function $G(z)$, a plurality of coefficients of the specific function $G(z)$ is retrieved (step S130). As known from the above Equation (4), a collection of the coefficients may be expressed as $\{g_n\}_{n=-L+1}^{L-1} = \{g_{-L+1} g_{-L+2} \ldots g_0 g_1 g_2 \ldots g_{L-1}\}$. Then, a cepstrum computation is performed on the plurality of coefficients $\{g_n\}_{n=-L+1}^{L-1}$ of the specific function $G(z)$, so as to obtain a plurality of quefrency coefficients (step S135). In other words, the plurality of coefficients $\{g_n\}_{n=-L+1}^{L-1}$ is transformed to a cepstrum domain. The step S135 further includes a plurality of sub-steps, as shown in FIG. 2.

Figure 2:
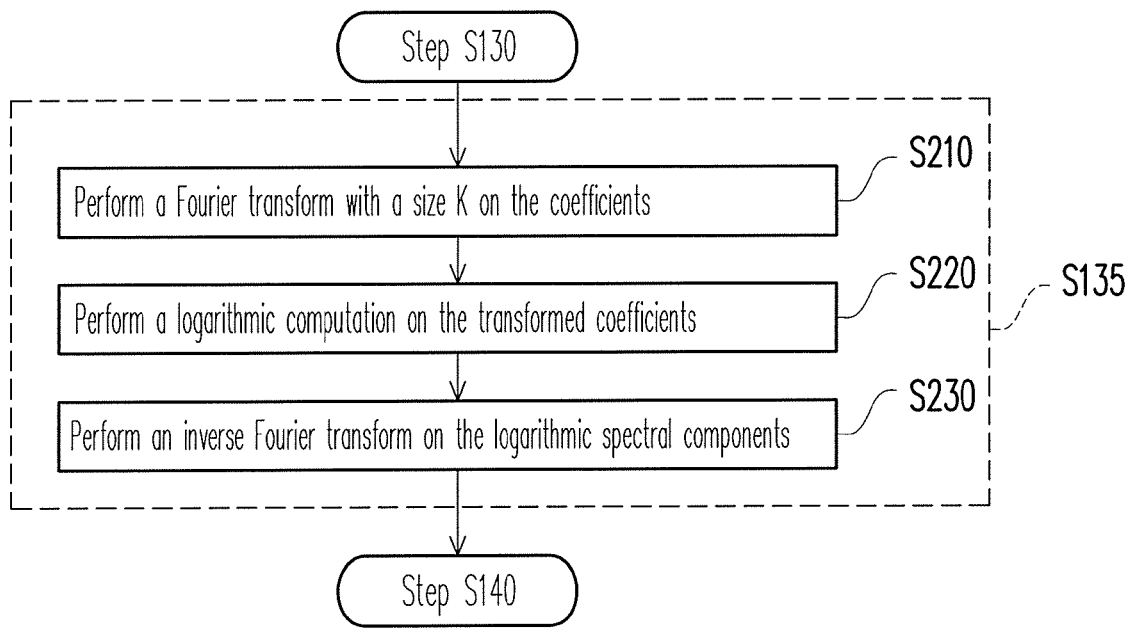
FIG. 2 is a flow chart of step S135 according to the embodiment of the present invention.

Referring to FIG. 2, firstly, the Fourier transform with a size K is performed on the plurality of coefficients $\{g_n\}_{n=-L+1}^{L-1}$ (step S210). The size of the Fourier transform is not limited in this embodiment, but may be determined by those of ordinary skill in the art according to the actual hardware allocation when implementing the present invention.

In the step S210, the plurality of coefficients $\{g_n\}_{n=-L+1}^{L-1}$ is, for example, sequentially taken as the input for the Fourier transform, so as to perform the Fourier transform. However, the input of the Fourier transform has, for example, indexes of 0~K−1. The coefficients $\{g_i\}_{i=0}^{L-1}$ at 0~L−1 are taken as the input of the Fourier transform at the indexes of 0~L−1, that is, the positive $z^{th}$ power of the coefficients are sequentially inputted into the Fourier transform at the input indexes of 0~L−1 according to the magnitude of the power. In other words, the coefficient $g_i$ is taken as the input for the $i^{th}$ index of the Fourier transform, in which i is, for example, an integer between 0~L−1. Furthermore, the coefficients $\{g_j\}_{j=-L+1}^{-1}$ at −L+1~−1 are sequentially taken as the input for the Fourier transform at the indexes of K−L+1~K−1, that is, the negative $z^{th}$ power of the coefficients are sequentially inputted into the Fourier transform as the input at the input indexes of K−1~K−L+1 according to the sequence in reverse to the magnitude of the power. In other words, the coefficient $g_j$ is taken as the input for the $(K+j)^{th}$ index of the Fourier transform, in which j is, for example, an integer between −1~−L+1.

As known from the above manner of putting the coefficients $\{g_n\}_{n=-L+1}^{L-1}$ into the Fourier transform as the input, the relationship between the size K of the Fourier transform and the channel length L needs to, for example, satisfy K≧2L−1, and in the other index positions of the Fourier transform without input data, 0 or a constant value is, for example, put therein. According to the manner of putting the coefficients $\{g_n\}_{n=-L+1}^{L-1}$ into the Fourier transform, the Fourier transform is performed on the coefficients $\{g_n\}_{n=-L+1}^{L-1}$, so as to obtain $\{G_k\}_{k=0}^{K-1}$.

Then, a logarithmic computation is performed on the resulted $\{G_k\}_{k=0}^{K-1}$ after the Fourier transform, so as to obtain a plurality of logarithmic spectral components from the collection of the coefficients (step S220), and the logarithmic spectral components may be expressed as $\{\log(G_k)\}_{k=0}^{K-1}$. Finally, an inverse Fourier transform is performed on the logarithmic spectral components $\{\log(G_k)\}_{k=0}^{K-1}$, so as to obtain a plurality of quefrency coefficients (step S230), and the quefrency coefficients may be expressed as $\{q_n\}_{n=0}^{K-1}$.

Then, referring back to FIG. 1, after obtaining the plurality of quefrency coefficients $\{q_n\}_{n=0}^{K-1}$, a part of the quefrency coefficients is selected to perform the Fourier transform with a limited size, so as to obtain a plurality of spectral components (step S140), in which the plurality of spectral components are expressed as $\{Q_k\}_{k=0}^{K-1}$. In the step S140 of this embodiment, the size of the Fourier transform is, for example, K, and the input of the Fourier transform has index positions of, for example, 0~K−1. In the above step of selecting a part of the quefrency coefficients $\{q_n\}_{n=0}^{K-1}$, a result of dividing the quefrency coefficients $q_0$ at n=0 by a first specific value is taken as an input of the Fourier transform at the index position of 0, and the first specific value may be a positive integer, and it is, for example, 2 in this embodiment. The quefrency coefficients $\{q_n\}_{n=1}^{K/D-1}$ at n=1~K/D−1 are sequentially taken as the input of the Fourier transform at the index positions of 1~K/D−1, in which D may be a positive integer, and it is, for example, 2 in this embodiment. The input at the other index positions K/D~K−1 of the Fourier transform is a second specific value, which is an integer, and in this embodiment, the second specific value is, for example, 0.

As known from the above, in this embodiment, merely a part of the quefrency coefficients $\{q_0/2\}\cup\{q_n\}_{n=1}^{K/2-1}$ is selected for performing the Fourier transform, and the other inputs for Fourier transform are padded with 0. Furthermore, as known from the above Equation (2), when the specific function G(z) is factorized into two functions through the spectral factorization, which are then multiplied with each other, a denominator function A(z) is obtained, and thus, the step of selecting a part of the quefrency coefficients $\{q_n\}_{n=0}^{K-1}$ may be taken as factorizing the coefficients of the specific function G(z) into halves in the cepstrum domain.

After obtaining the spectral components $\{Q_k\}_{k=0}^{K-1}$, an exponential computation is performed on the spectral components $\{Q_k\}_{k=0}^{K-1}$, so as to obtain a plurality of exponential spectral components $\{\exp(Q_k)\}_{k=0}^{K-1}$ (step S145). Then, the inverse Fourier transform is performed on the plurality of exponential spectral components $\{\exp(Q_k)\}_{k=0}^{K-1}$, so as to obtain a plurality of coefficient candidates (step S150). In this embodiment, since the size of the inverse Fourier transform is K, the number of the coefficient candidates obtained through the inverse Fourier transform is, for example, K, which may be expressed as $\{f_n\}_{n=0}^{K-1}$.

Then, a part of the coefficient candidates $\{f_n\}_{n=0}^{K-1}$ is selected (step S155). The number of the selected coefficient candidates may be adjusted according to the actual hardware, for example, the first G coefficient candidates may be expressed as $\{f_n\}_{n=0}^{G-1}$. In this embodiment, the value G is, for example, set as the estimated channel length L, and thus the selected coefficient candidates are expressed as $\{f_n\}_{n=0}^{L-1}$. Then, the selected coefficient candidates are standardized to serve as the coefficients Ã(z) of the denominator function of the filter, so as to form the denominator function Ã(z) (step S160). Herein, the coefficients Ã(z) of the denominator function may be expressed as $\{a_n\}_{n=0}^{L-1}$. In this embodiment, the normalization is, for example, setting a coefficient $a_0$ of the $0^{th}$ power of z in the denominator function Ã(z) as 1, and the coefficient candidate corresponding to the coefficient of the $0^{th}$ power of z is, for example, $f_0$. Therefore, the coefficient candidates after the normalization may be expressed as $\{f_n/f_0\}_{n=0}^{L-1}$. The denominator function A(z) formed by taking $\{f_n/f_0\}_{n=0}^{L-1}$ as the coefficients may be expressed as:

$$\tilde{A}(z) = a_0 + a_1 z^{-1} + a_2 z^{-2} + \ldots + a_{L-1} z^{-(L-1)}$$
$$= 1 + \frac{f_1}{f_0} z^{-1} + \frac{f_2}{f_0} z^{-2} + \ldots + \frac{f_{L-1}}{f_0} z^{-(L-1)}.$$

After obtaining the coefficients of the denominator function Ã(z), the obtained coefficients of the denominator function Ã(z) and the estimated channel response Ĥ(z) are used to calculate the coefficients of the numerator function B̃(z) of the filter (step S165), in which the coefficients of the numerator function B̃(z) are expressed as $\{b_n\}_{n=0}^{M}$. After obtaining the coefficients of the denominator function Ã(z) and the coefficients of the numerator function B̃(z), the transfer function of the designed filter is obtained, which has a mathematical equation as:

$$W(z) = \frac{\tilde{B}(z)}{\tilde{A}(z)}$$
$$= \frac{b_0 + b_1 z^{-1} + \ldots + b_{M-1} z^{-(M-1)} + b_M z^{-M}}{a_0 + a_1 z^{-1} + \ldots + a_{L-2} z^{-(L-2)} + a_{L-1} z^{-(L-1)}}.$$

The filter in this embodiment, for example, serves as an equalizer in the receiver, which aims at eliminating the interferences to the signal caused by the transmission channel. Therefore, in terms of the mathematical derivation, the designed filter must satisfy the equation $$\tilde{B}(z)\tilde{\alpha}\tilde{A}_{\#}(z) = z^{-M} H_{\cap}(z) \qquad (4),$$

in which, $\tilde{\alpha}=f_0^2$, and the $\tilde{B}(z)\tilde{\alpha}\tilde{A}_{\#}(z)$ at left of the equal sign in the Equation (4) may be spread as:

$$\tilde{B}(z)\tilde{\alpha}\tilde{A}_{\#}(z) = (b_0+b_1 z^{-1}+\ldots+b_M z^{-M})\tilde{\alpha}(a^*_{L-1} z^{L-1}+\ldots a^*_1 z+1);$$

and $z^{-M} H_{\#}(z)$ at right of the equal sign in the Equation (4) may be spread as:

$$z^{-M} H_{\#}(z) = z^{-M}(h^*_{L-1} z^{L-1}+\ldots+h^*_2 z^2+h^*_1 z+h^*_0).$$

In order to enable those of ordinary skill in the art to implement the present invention under the teaching of this embodiment, how to calculate the coefficients of the numerator function $\tilde{B}(z)$ of the filter in step S165 and enable the coefficients to satisfy the Equation (4) may be illustrated below. Firstly, a square $f_0^2$ of the above $f_0$ is calculated. Next, a coefficient $b_M$ of the numerator function $\tilde{B}(z)$ is calculated, in which $b_M = h^*_0/\tilde{\alpha}$, and $\tilde{\alpha} = f_0^2$. Then, the coefficients $\{b_n\}_{n=M-L}^{M-1}$ are calculated through a recursive manner. Then, the coefficients $b_{M-1}, b_{M-2}, \ldots, b_{M-L+1}$ of the numerator function are sequentially calculated from the coefficient $b_{M-1}$ according to the mathematical equation:

$$b_n = h^*_{M-n}/\tilde{\alpha} - \sum_{m=1}^{M-n} a^*_m \cdot b_{n+m} \text{ in which,} \quad (5)$$

$$M - L + 1 \le n \le M - 1.$$

Finally, if the length M+1 of the designed numerator function $\tilde{B}(z)$ is larger than or equal to L+1, as known from the Equation (5), the coefficients $\{b_n\}_{n=0}^{M-L}$ need to be further calculated, and the calculating sequence is, for example, to sequentially calculate the coefficients $b_{M-L}, b_{M-L-1}, \ldots, b_0$ from the sub-coefficient $b_{M-L}$ according to the mathematical equation:

$$b_n = -\sum_{m=1}^{L-1} a^*_m \cdot b_{n+m} \text{ in which,} \quad 0 \le n \le M - L. \quad (6)$$

Figure 3:
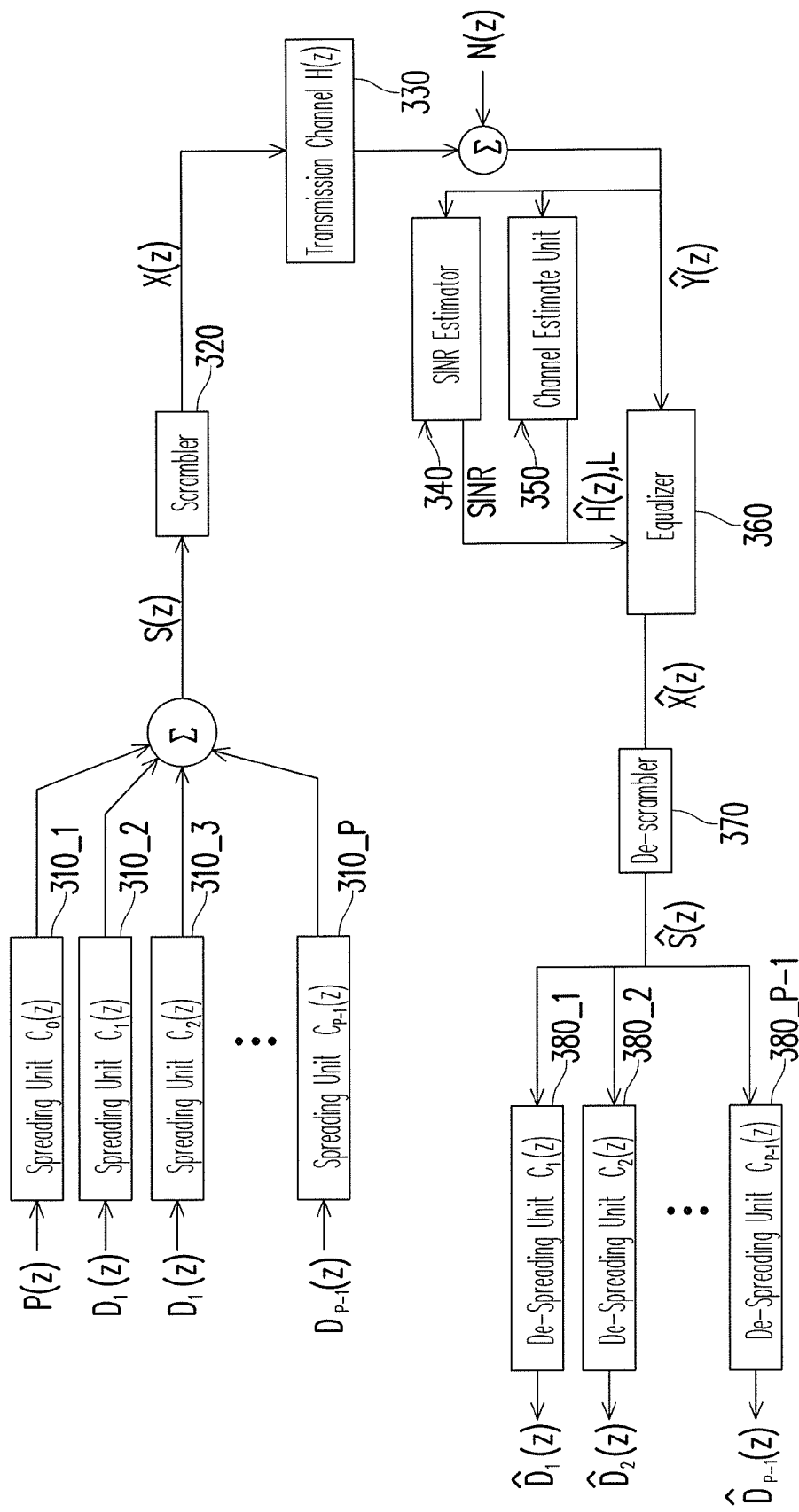
FIG. 3 is a schematic view of CDMA system.

The method for calculating coefficients of a filter provided in the above embodiment may be applied to the Code Division Multiple Access (CDMA) system, as shown in FIG. 3. Referring to FIG. 3, P-1 user data $D_1(z), D_2(z), \ldots, D_{P-1}(z)$ and a pilot signal are respectively multiplied by corresponding spreading codes $C_0(z), C_1(z), C_2(z), \ldots, C_{P-1}(z)$ with despreading units 310_1~310_P, and then the obtained results are summed up as S(z). Then, S(z) is scrambled by a scrambler 320 into X(z), and then X(z) is sent to a transmission channel 330, and meanwhile the transmitted signal X(z) is affected by the channel response H(z) and noises N(z), and thus the signal received by the receiver is Y(z). Then, the signal Y(z) is input into an SINR estimator 340, a channel estimate unit 350 and an equalizer 360.

The SINR estimator 340 estimates the SINR, and the channel estimate unit 350 estimates the channel response $\hat{H}(z)$ and the channel length L. The equalizer 360 may be implemented as an IIR filter, and the present invention may be applied to the equalizer 360 to calculate the coefficients of the filter through using the estimated SINR and $\hat{H}(z)$. After the equalizer 360 eliminates the interferences of the signal Y(z) in the channel, it outputs $\hat{X}(z)$. The de-scrambler 370 de-scrambles the signal $\hat{X}(z)$ and then outputs $\hat{S}(z)$. $\hat{S}(z)$ is de-spread by the de-spreading units 380_1~380_P-1 to obtain the P-1 user data $\hat{D}_0(z), \hat{D}_1(z), \hat{D}_2(z), \ldots, \hat{D}_{P-1}(z)$.

Figure 4:
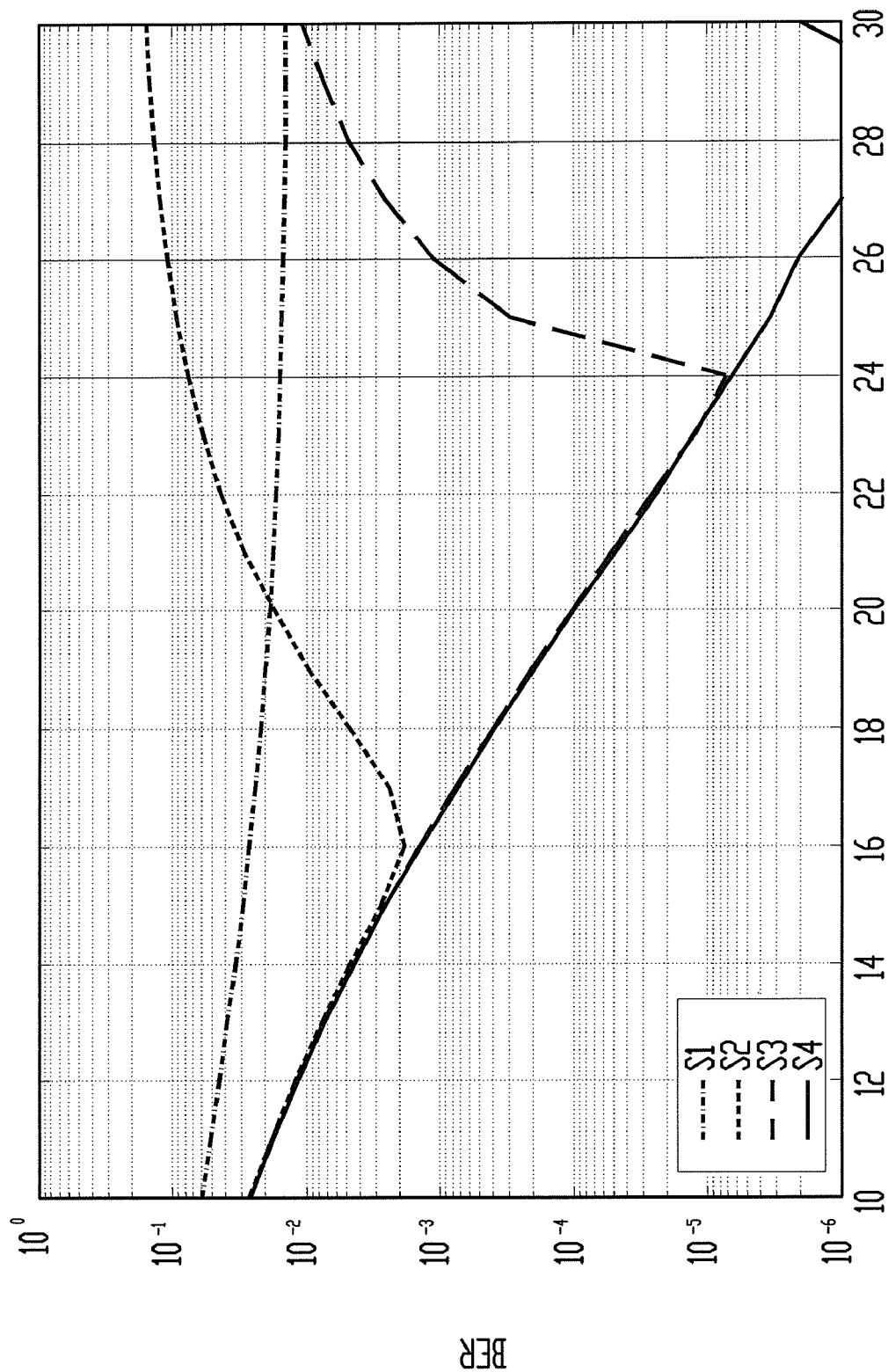
FIG. 4 is a BER tendency chart of a receiver under different SINRs.

The above CDMA system is simulated below through computer simulation, and the transmission channel is simulated as a multipath fading channel, with the channel length L=64. FIG. 4 is a bit error rate (BER) tendency chart of a receiver under different SINRs. Referring to FIG. 4, the first curve S1 is obtained when the equalizer 360 is implemented as a 64-taps FIR filter. The second to fourth curves S2~S4 are obtained when the equalizer 360 is implemented as the IIR filter proposed in the above embodiment. When the second curve S2 adopts the coefficients of the filter, the size of the Fourier transform is K=128. When the third curve S3 adopts the coefficients of the filter, the size of the Fourier transform is K=256. When the fourth curve S4 adopts the coefficients of the filter, the size of the Fourier transform is K=512. When calculating the coefficients of the filter, the larger size of the used Fourier transform is, the better the receiver performance is. However, when the SINR is relatively large, S2~S4 also has the phenomenon of performance divergence, and furthermore, under the Fourier transform with different size K, the divergence position in FIG. 4 also varies. Therefore, it can be known from the above simulation that, the BER divergence position at the receiver is relevant to the channel length L, the size K of the Fourier transform, and the SINR.

The reason for causing the above phenomenon lies in that, in the above Equation (2), $\hat{H}(z)\hat{H}_\#(z)+SINR^{-1}$ is factorized through the spectral factorization, so as to obtain the denominator function A(z). From the aspect of the mathematical theory, in order to enable the factorized A(z) to satisfy the above Equation (1), the continuous Fourier transforms must be used to perform the spectral factorization (Note [2]). However, during the above spectral factorization process, considering the actually adopted hardware, all the above Fourier transforms are, for example, discrete Fourier transforms with a limited size, and as a result, the obtained denominator function $\tilde{A}(z)$ can only approach the above Equation (1). The obtained $\tilde{A}(z)$ may be written as:

$$\tilde{\alpha}\tilde{A}(z)\tilde{A}_\#(z) \approx H(z)H_\#(z) + SINR^{-1} - \tau(SINR, K, L) \quad (7),$$

in which, $\tau(SINR, K, L)$ is, for example, a constant polynomial relevant to SINR, K and L.

When observing the above Equation (7) in terms of the frequency, and substituting z in the above Equation (7) with $z = e^{j\omega}$, the following equation is obtained:

$$\tilde{\alpha}|\tilde{A}(e^{j\omega})|^2 \approx |H(e^{j\omega})|^2 SINR^{-1} - \tau(SINR, K, L) \quad (8).$$

The effect of the subtrahend item $\tau(SINR, K, L)$ may be observed from the above Equation (8). When the channel is relatively poor, for example, the value of $|H(e^{j\omega})|$ approaches zero under a certain frequency, the above subtrahend item $\tau(SINR, K, L)$ causes the denominator function $|\tilde{A}(e^{j\omega})|$ of the frequency response $|\tilde{B}(e^{j\omega})/\tilde{A}(e^{j\omega})|$ of the filter to approach zero. As a result, the filter becomes unstable, and thus the performance of the receiver is severely reduced, thereby the above phenomenon of performance divergence occurs at the receiver as in the above simulation shown in FIG. 4. In order to avoid the phenomenon of performance divergence, a Fourier transform with an excessively large size must be adopted, but the corresponding excessive high computation complexity greatly restricts the applications of the cepstrum method.

In order to avoid the instability of the filter and to eliminate the restrictions on the applications of the cepstrum method, a compensation function $C_p(z)$ is further added in the above specific function G(z) in this embodiment. The compensation function $C_p(z)$ is, for example, a polynomial, which is, for example, relevant to the size K of the Fourier transform, the length L of the channel response, and the SINR, and thus may also be expressed as $C_p(z; K, L, SINR)$. In other words, the steps in this embodiment are similar to those in the above embodiment, but the difference there-between lies in that the mathematical equation of the specific function G(z) in the step S125 is converted into:

$$G(z) = \hat{H}(z)\hat{H}_\#(z) + SINR^{-1} + C_p(z; K, L, SINR).$$

Then, the denominator function $\tilde{A}(z)$ and the numerator function $\tilde{B}(z)$ are calculated through using the spectral factorization similarly (step S130-165).

In order to enable those of ordinary skill in the art to implement the present invention through this embodiment, how to calculate the compensation function is illustrated below, and the above compensation function is, for example, a constant. It is supposed that the compensation function is only relevant to the size K of the Fourier transform, and thus, the compensation function may be expressed as $C_p(z; K)$. The process for calculating the compensation function $C_p(z; K)$ is, for example, using the system simulation or using the known signals at the receiver, for example, training sequence or pilot signal, etc. When the compensation function $C_p(z; K)$ is not added, performing spectral factorization on the original specific function G(z), so as to calculate the denominator function $\tilde{A}(z)$ and the numerator function $\tilde{B}(z)$ Meanwhile, making statistics about the performance of the receiver under different SINRs, and finding out a specific SINR corresponding to the circumstance of performance divergence at the receiver in order to determine the compensation function $C_p(z; K)$ according to the specific SINR.

In other words, under an off-line state, this embodiment utilizes the stimulation results to obtain the compensation functions $C_p(z; K)$ corresponding to different K values beforehand, and then creates a specific table for recording the relationship between K and the compensation functions $C_p(z; K)$. In the actual hardware device, the specific table is used to determine the compensation function $C_p(z; K)$, and then the compensation function $C_p(z; K)$ is added into the above specific function G(z) so as to calculate the coefficients of the filter with a high stability. Alternatively, under an on-line state, this embodiment utilizes the known signals at the receiver to calculate the compensation function $C_p(z; K)$ corresponding to the K value, and then adds the compensation function $C_p(z; K)$ into the above specific function G(z) so as to calculate the coefficients of the filter with a high stability.

Taking the curve S2 in FIG. 4 as an example, the SINR corresponding to the position where the BER divergence occurs is about 16 dB, and thus, when the size of the Fourier transform K=128, the compensation function $C_p(z; K)$ in this embodiment may be set as $C_p(z; K)$=−16 dB, and the reset can be deduced by analogy. As known from FIG. 4 that, if K=256, $C_p(z; K)$=−24 dB is satisfied and if K=512, $C_p(z; K)$=−27 dB is satisfied.

Figure 5:
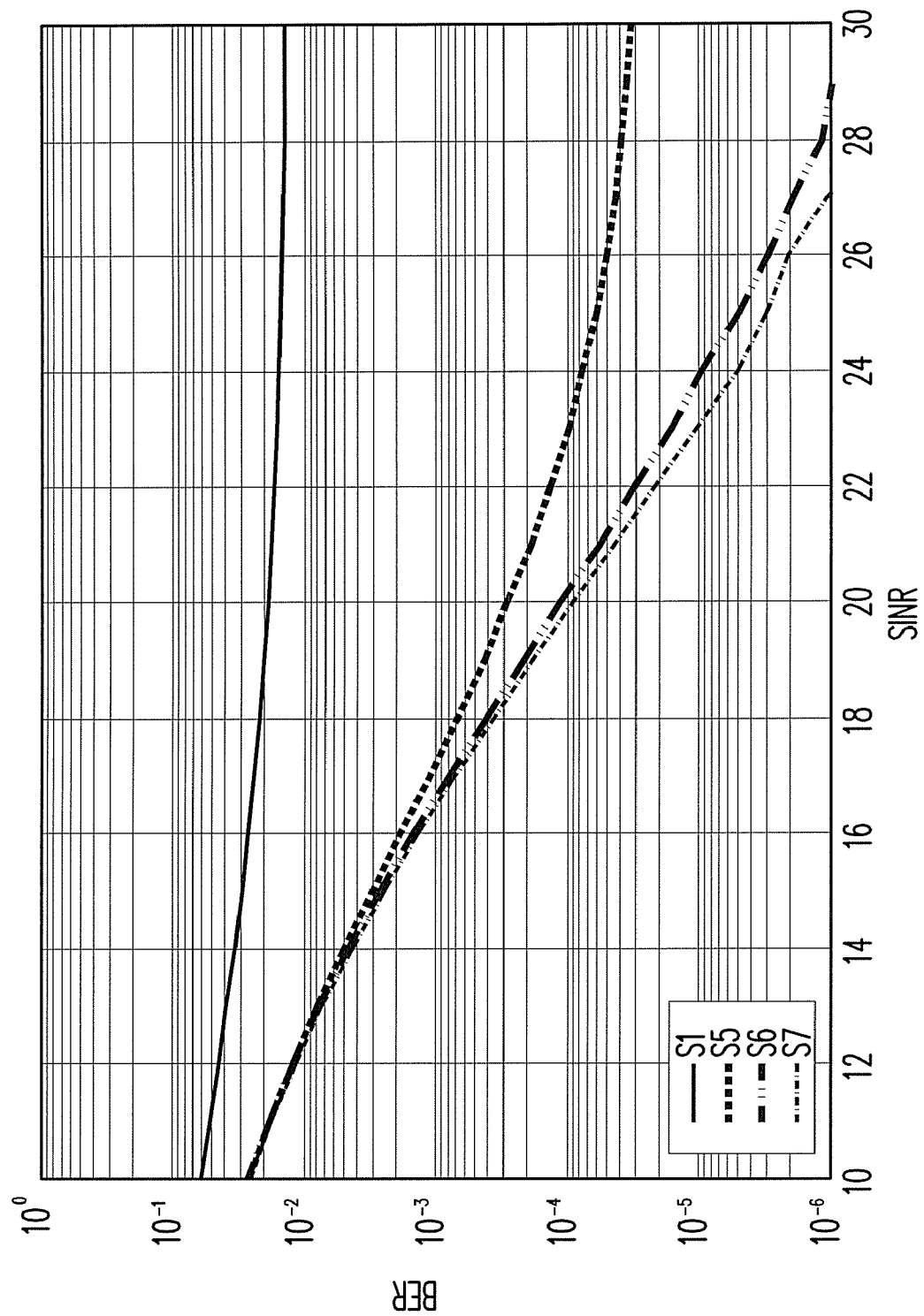
FIG. 5 is a BER tendency chart of the receiver under different SINRs after applying a compensation function.

According to the above set compensation functions $C_p(z; K)$, under the simulation environment the same as that in FIG. 4, the BER at the receiver under different SINRs are simulated through computer simulation, which are shown in FIG. 5. Referring to FIG. 5, the first curve S1 is the same as the curve S1 in FIG. 4, and the equalizer 360 is implemented as a 64-taps FIR filter. The second to fourth curves S5~S7 are obtained when the equalizer 360 is implemented as the IIR filter proposed in the above embodiment, and the above compensation function $C_p(z; K)$ is added respectively according to the size K of the Fourier transform. When the second curve S5 adopts the coefficients of the filter, the size of the Fourier transform is K=128, the compensation function $C_p(z; K)$=−16 dB When the third curve S6 adopts the coefficients of the filter, the size of the Fourier transform is K=256, and the compensation function $C_p(z; K)$=−24 dB. When the fourth curve S7 adopts the coefficients of the filter, the size of the Fourier transform K=512, and the compensation function $C_p(z; K)$=−27 dB. As observed from FIG. 5 that, after the compensation function $C_p(z; K)$ is added, the performance divergence at the receiver is apparently disappeared. That is to say, after the compensation function $C_p(z; K)$ is added in this embodiment, the Fourier transform with a smaller size can be used, and meanwhile, the receiver can achieve a desired performance, thereby reducing the computations required for calculating the coefficients of the filter.

However, those of ordinary skill in the art should know that, the above compensation function may take the SINR corresponding to the position where the BER divergence occurs as the value of the compensation function, or take the SINR corresponding to the position close to the position where the BER divergence occurs as the value of the compensation function. Furthermore, those of ordinary skill in the art should know that, the transmission channel with a fixed length L is used in the above computer simulation, but the channel length in the actual transmission may not be fixed, and thus the compensation function may be relevant to the channel length L and the size K of the Fourier transform, which may be expressed as $C_p(z; K,L)$ Herein, compensation functions $C_p(z; K,L)$ corresponding to different ratios K/L of the channel length L and the size K of the Fourier transform may be obtained under an on-line or off-line mode, and thus further calculating the coefficients of the filter with a high stability by using the obtained compensation function $C_p(z; K,L)$.

As known from the above embodiment that, the method for calculating coefficients of a filter provided in the present invention belongs to a non-iterative algorithm, which thus avoids the time consumption and convergence problems when calculating the coefficients of the filter. Furthermore, through using the compensation function in this embodiment, the Fourier transform with a significantly reduced size can be used under the premise of ensuring the performance of the filter, so as to reduce the computation complexity when calculating the coefficients, and thus eliminating the restrictions in the applications of the cepstrum method.

Figure 6:
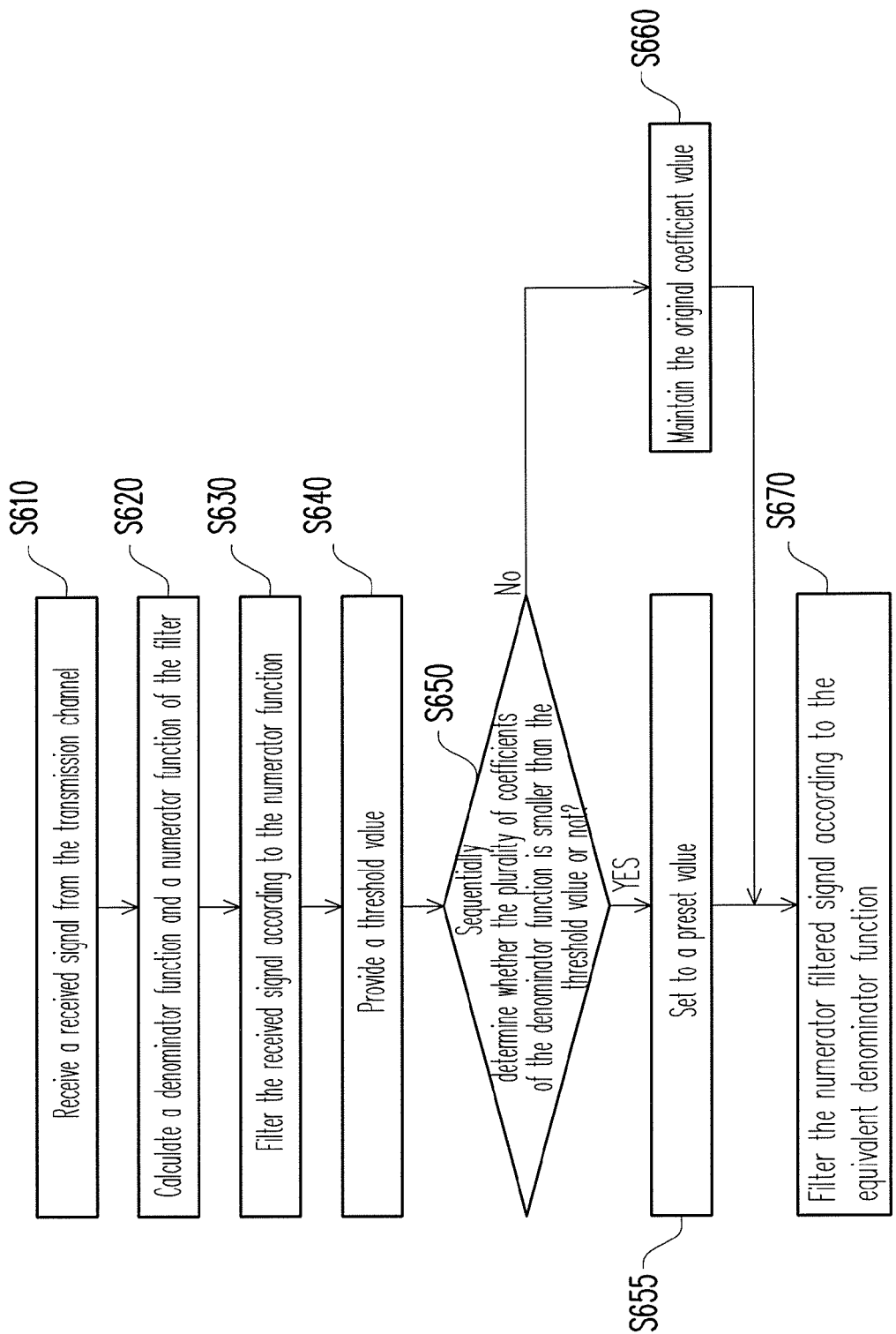
FIG. 6 is a flow chart of method for filtering according to an embodiment of the present invention.

Referring to FIG. 6, a received signal Y(z) from the transmission channel is received (step S610). Next, a denominator function and a numerator function of the filter are calculated (step S620). In step S620, the method for calculating the coefficients may be, for example, as that mentioned in the above embodiment or other algorithms for calculating the coefficients of a filter. Then, a feed-forward filter is used for filtering the received signal Y(z) according to the numerator function $\tilde{B}(z)$, so as to obtain a numerator filtered signal (step S630), in which the numerator filtered signal may be expressed as $\{v_n\}_{n=-L}^{L-1}$, and the z transform may be expressed as V(z).

Then, a threshold value is provided (step S640), then, it is sequentially determined whether the plurality of coefficients $\{a_n\}_{n=0}^{L-1}$ of the denominator function is smaller than the threshold value or not (step S650), and then the coefficients smaller than the threshold value are set to a preset value (step S655), and the coefficients larger than or equal to the threshold value are maintained at the original value (step S660), so as to adjust the denominator function to an equivalent denominator function. In this embodiment, the above preset value is, for example, 0, and the threshold value is, for example, $\eta/L$, in which $\eta$ is a system-adjustable positive integer, and the coefficients of the equivalent denominator function are expressed as $\breve{a}_n$, and the mathematical equation thereof may be expressed as:

$$\breve{a}_n = \begin{cases} a_n, & \text{if } |a_n|^2 \geq \eta/L \\ 0, & \text{if } |a_n|^2 < \eta/L \end{cases}.$$

Finally, a feedback filter is used for filtering the numerator filtered signal V(z) according to the equivalent denominator function, so as to obtain a final filtered signal (step S670), in which the final filtered signal is expressed as $\hat{x}_n$, and the z transform is expressed as $\hat{X}(z)$. The filtering process in the step S670 is performed in a recursive mode, so as to sequentially calculate $\hat{x}_1, \hat{x}_2, \hat{x}_3, \ldots$, and the mathematical equation of the final filtered signal $\hat{x}_n$ may be expressed as:

$$\hat{x}_n = \begin{cases} v_n - \sum_{m=1}^{L-1} \tilde{a}_m \hat{x}_{n-m}, & \text{if } n > 0 \\ 0, & \text{if } n \leq 0 \end{cases}.$$

In the above embodiment, the lengths of the denominator function $\tilde{A}(z)$ are all, for example, the channel length L. However, the length of the denominator function $\tilde{A}(z)$ may be determined depending upon the actual hardware restrictions. Furthermore, the above steps S650-660 are used to delete smaller coefficients, such that the number of the effective coefficients of the denominator function $\tilde{A}(z)$ is turned from the original L into a smaller $\check{L}$, in which the $\check{L}$ indicates the remaining number of effective coefficients. As known from the above filtering in the above embodiment, $\check{L}$ determines the number of multiplication computations performed in the step S670, and thus, if the system-adjustable η is increasingly large, the filtering complexity can be effectively reduced.

Figure 7:
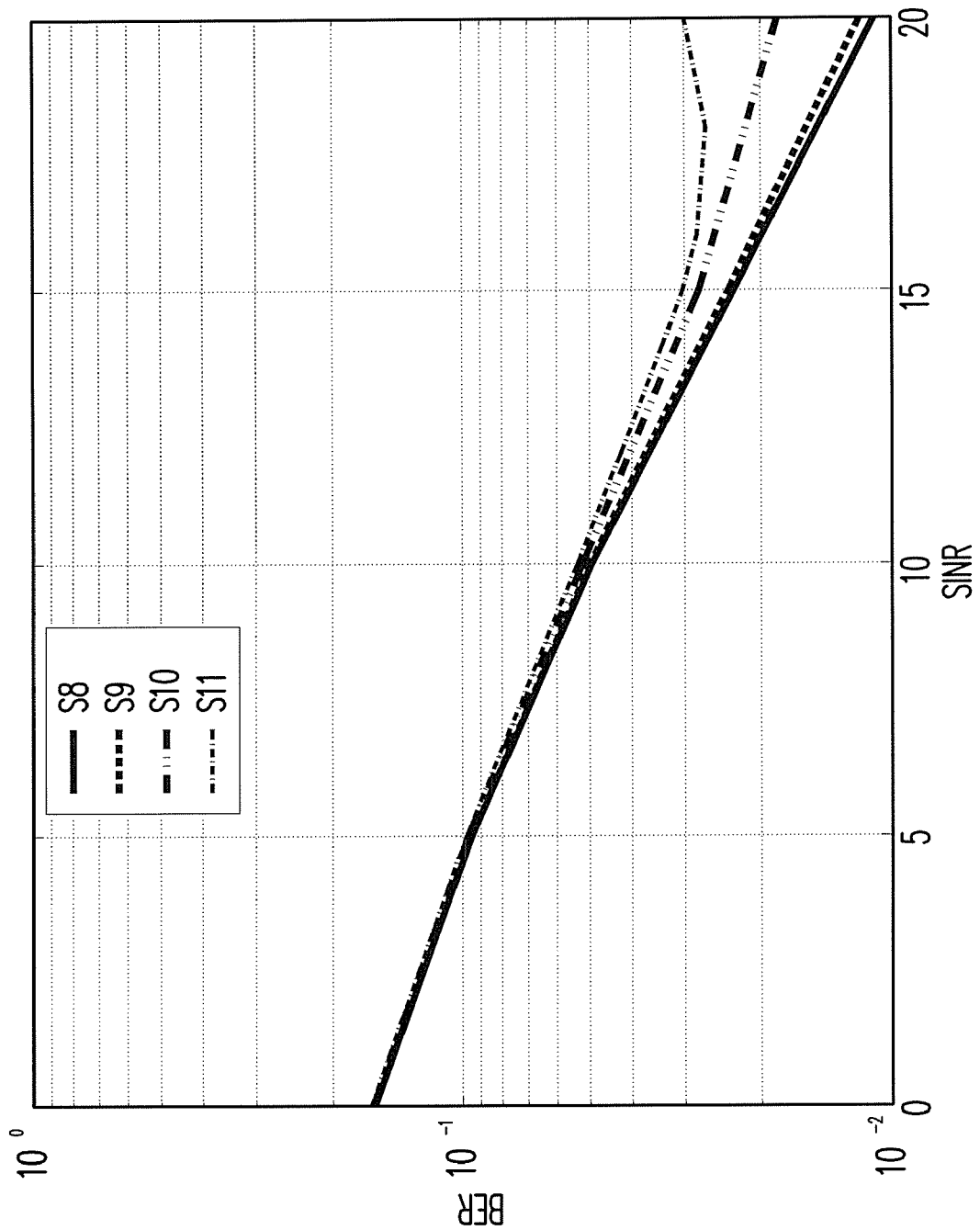
FIG. 7 is a BER tendency chart of the receiver under different SINRs after simplifying the denominator filtering function.

The CDMA system is simulated through computer simulation, and the performance of the receiver is also simulated under different η values. The simulated transmission channel is a channel model of ITU Vehicular B (Note [3]), in which the channel model of ITU Vehicular B takes the delay spread as 77 chip durations for the simulation. However, merely several paths have large energy, and the simulation results are shown in FIG. 7. FIG. 7 is a BER tendency chart of the receiver under different SINRs. Referring to FIG. 7, the first curve S8 is used to simulate η=0, and the length of the denominator function $\tilde{A}(z)$ L is 80. The second curve S9 is used to simulate η=$10^{-2}$, and the length L of the denominator function $\tilde{A}(z)$ is simplified from 80 to $\check{L}$ is 22. The third curve S10 is used to simulate η=$10^{-1}$, and the length L of the denominator function $\tilde{A}(z)$ is simplified from 80 to $\check{L}$=9. The fourth curve S11 is used to simulate η=$2\times10^{-1}$, and the length L of the denominator function $\tilde{A}(z)$ is simplified from 80 to $\check{L}$=6. As known from FIG. 7 that, the larger the η is, the smaller the number of the effective coefficients of the simplified denominator function is, which however is capable of significantly reducing the complexity of the filtering process while maintaining affects to the performance of the receiver at a restricted level.

To sum up, the embodiments of the present invention may have the following advantages.

1. In the present invention, the spectral factorization and the cepstrum technique are used to directly factorize the specific function in the cepstrum domain, so as to obtain the coefficients of the denominator function of the filter. In other words, a non-iterative algorithm is adopted in the present invention, which is capable of reducing the complexity cost when calculating the coefficients, and further solving the convergence problem.

2. After the compensation function is added to the specific function in this embodiment, the Fourier transform with a smaller size can be used, and meanwhile enable the receiver to achieve a low BER. In other words, this embodiment can reduce the complexity for calculating the filter while maintaining a certain performance of the receiver, thereby eliminating the restrictions on the applications of the cepstrum technique.

3. The embodiments of the present invention are capable of simplifying the denominator function of the filter during filtering, and thus reducing the number of the multiplication computations, and saving the computations when calculating the filter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Note [1]: A. Ahlen and M. Stemad, "Wiener filter design using polynomial equation" IEEE Trans. Signal processing, vol. 39, no. 11, pp. 2387-2399, November 1991.

Note [2]: T. N. T. Goodman C. A. Micchelli, G Rodriguez. And S. Seatzu, "Spectral factorization of Laurent polynomials," Springer J. Advances Computational Math., vol. 7, no. 4, pp. 429-454, Aug. 1997.

Note [3]: ITU-R, "Guidelines for the evaluation of radio transmission technologies for IMT-2000", ITU-R Recommendation M. 1225, 1997.

What is claimed is:

1. A method implemented in a Code Division Multiple Access (CDMA) system for forming a filter with filtering coefficients, wherein the filter is adapted to an equalizer of a receiver to eliminate interferences to a received signal from the receiver caused by transmission channel, the method comprising:
   a. estimating a channel response of the transmission channel;
   b. estimating a signal-to-interference-plus-noise power ratio (SINR) for the received signal from the receiver;
   c. calculating an autocorrelation function of the channel response;
   d. summing up the autocorrelation function of the channel response, a reciprocal of the SINR, and a compensation function, so as to obtain a specific function;
   e. retrieving a plurality of coefficients from the specific function;
   f. performing a cepstrum computation on the plurality of coefficients, so as to correspondingly obtain a plurality of quefrency coefficients;
   g. selecting a part of the plurality of quefrency coefficients to perform a Fourier transform with a limited size, so as to obtain a plurality of spectral components;
   h. applying an exponential computation on the spectral components, so as to obtain a plurality of exponential spectral components;
   i. applying an inverse Fourier transform with the limited size on the exponential spectral components, so as to obtain a plurality of coefficient candidates;
   j. selecting a part of the plurality of coefficient candidates, and normalizing the plurality of coefficient candidates to serve as coefficients of a denominator function of the filter, so as to form the denominator function; and
   k. calculating coefficients of a numerator function of the filter according to the coefficients of the denominator function and the channel response.

2. The method for calculating coefficients of a filter according to claim 1, wherein the step f comprises:
   f1. applying the Fourier transform with a size K on the plurality of coefficients, wherein K is a positive integer;
   f2. applying a logarithmic computation on the plurality of coefficients after applying the Fourier transform, so as to correspondingly obtain a plurality of logarithmic spectral components; and f3. applying an inverse Fourier transform on the logarithmic spectral components, so as to obtain the quefrency coefficients.

3. The method for calculating coefficients of a filter according to claim 2, wherein the channel response is expressed as $\hat{h}(n)$, a Z-transform of the channel response is $\hat{H}(z)=\Sigma_n \hat{h}(n) z^{-n}$, and the autocorrelation function of the channel response is $\hat{H}(z)\hat{H}_\#(z)$, wherein $\hat{H}_\#(z)=\hat{H}^*((z^*)^{-1})=\Sigma_n \hat{h}^*(n)z^n$.

4. The method for calculating coefficients of a filter according to claim 3, further comprising:
providing the compensation function, wherein the compensation function is relevant to the size of the Fourier transform, and expressed as $C_p(z)$, the specific function is expressed as $G(z)$, wherein $G(z)$ can be expressed as $\hat{H}(z)\hat{H}_\#(z)+SINR^{-1}+C_p(z)$.

5. The method for calculating coefficients of a filter according to claim 2, wherein the specific function is expressed as $G(z)$, a length of the channel response is expressed as $L$, wherein $L$ is a positive integer, and the step e further comprises:
converting the specific function $G(z)$ into a polynomial of a Z function, wherein $G(z)=g_{-L+1}z^{-L+1}+g_{-L+2}z^{-L+2}+\ldots+g_0+g_1z+g_2z^2+\ldots+g_{L-1}z^{L-1}$, and a collection of the coefficients is expressed as $\{g_n\}_{n=-L+1}^{L-1}$.

6. The method for calculating coefficients of a filter according to claim 5, wherein the size of the Fourier transform is expressed as $K$, and $K$ is larger than or equal to $2L-1$, and the step f1 further comprises:
sequentially taking the $\{g_i\}_{i=0}^{L-1}$ as an input for the Fourier transform at an index position of $0\sim L-1$, sequentially taking $\{g_j\}_{j=-L+1}^{-1}$, as an input for the Fourier transform at an indexes of $K-L+1\sim K-1$, and performing the Fourier transform, wherein a result of the Fourier transform is expressed as $\{G_k\}_{k=0}^{K-1}$, and i, j and k are integers.

7. The method for calculating coefficients of a filter according to claim 6, wherein the logarithmic spectral components are $\{\log(G_k)\}_{k=0}^{K-1}$, the quefrency coefficients obtained after performing the inverse Fourier transform on the logarithmic spectral components $\{\log(G_k)\}_{k=0}^{K-1}$ are expressed as $\{q_n\}_{n=0}^{K-1}$, and the step g further comprises:
taking a result of dividing $q_0$ by a first specific value as an input of the Fourier transform at an index of 0, sequentially taking $\{q_n\}_{n=1}^{K/D-1}$ as an input of the Fourier transform at the indexes of $1\sim K/D-1$, taking a second specific value as an input of the Fourier transform at the indexes of $K/D\sim K-1$, and performing the Fourier transform, so as to obtain the spectral components $\{Q_k\}_{k=0}^{K-1}$, wherein D and the first specific value are positive integers, and the second specific value is an integer.

8. The method for calculating coefficients of a filter according to claim 7, wherein the exponential spectral components are $\{\exp(Q_k)\}_{k=0}^{K-1}$, the coefficient candidates obtained after performing the inverse Fourier transform on the exponential spectral components $\{\exp(Q_k)\}_{k=0}^{K-1}$ are expressed as $\{f_n\}_{n=0}^{K-1}$, and the denominator function of the filter is expressed as a polynomial $\tilde{A}(z)$, and the step j further comprises:
taking first P coefficient candidates from the coefficient candidates, to be expressed as $\{f_n\}_{n=0}^{P-1}$, wherein P is a positive integer; and
sequentially taking $\{f_n/f_0\}_{n=0}^{P-1}$ as coefficients corresponding to $z^{th}$ power of the denominator function $\tilde{A}(z)$, so as to obtain the denominator function $\tilde{A}(z)$.

9. The method for calculating coefficients of a filter according to claim 8, wherein the value P is equal to the length L of the channel response, the channel response is expressed as $h_n$, the coefficients of the denominator function $\tilde{A}(z)$ are expressed as $\{a_n\}_{n=0}^{L-1}$, the numerator function is expressed as $\tilde{B}(z)$, the coefficients of the numerator function are expressed as $\{b_n\}_{n=0}^{M}$, a length of the coefficients of the numerator function is M+1, wherein M is a positive integer, and the step k comprises:
calculating a square $f_0^2$ in the coefficient candidates;
calculating a coefficient $b_M$ of the numerator function, wherein $b_M=h_0^*/f_0^2$;
sequentially calculating the coefficients $b_{M-1}, b_{M-2}, \ldots, b_{M-L+1}$ of the numerator function according to a coefficient $b_{M-1}$, wherein when n is between $M-L+1\sim M-1$, the coefficients of the numerator function $\tilde{B}(z)$ are $$b_n = h_{M-n}^*/f_0^2 - \sum_{m=1}^{M-n} a_m^* \cdot b_{n+m};$$

and
when $M \geq L$, sequentially calculating the coefficients $b_{M-L}, b_{M-L-1}, \ldots, b_0$ of the numerator function $\tilde{B}(z)$ according to a coefficient $b_{M-L}$, wherein when n is between $0\sim M-L$, the coefficients of the numerator function $\tilde{B}(z)$ are $$b_n = -\sum_{m=1}^{L-1} a_m^* \cdot b_{n+m}.$$

10. The method for calculating coefficients of a filter according to claim 4, wherein the compensation function is relevant to the length of the channel response, and the SINR.

11. The method for calculating coefficients of a filter according to claim 4, wherein the step of providing the compensation function further comprises:
making a statistics about a performance of the receiver under different SINRs;
finding out a specific SINR corresponding to the performance of the receiver begins to diverge; and
determining the compensation function according to the specific SINR.

12. The method for calculating coefficients of a filter according to claim 4, wherein the step of providing the compensation function further comprises:
creating a specific table, for recording a corresponding relationship between the size of the Fourier transform and the compensation function.

13. The method for calculating coefficients of a filter according to claim 12, after the step of providing the compensation function, further comprising: finding out the compensation function by using the specific table based on the size of the Fourier transform.

* * * * *